United States Patent [19]
Pan

[11] Patent Number: 5,930,641
[45] Date of Patent: Jul. 27, 1999

[54] METHOD FOR FORMING AN INTEGRATED CIRCUIT CONTAINER HAVING PARTIALLY RUGGED SURFACE

[75] Inventor: Pai-Hung Pan, Boise, Id.

[73] Assignee: Micron Technology, Inc., Boise, Id.

[21] Appl. No.: 09/026,354

[22] Filed: Feb. 19, 1998

Related U.S. Application Data

[62] Division of application No. 08/575,120, Dec. 19, 1995, Pat. No. 5,801,413.

[51] Int. Cl.$^6$ .................................................... H01L 21/20
[52] U.S. Cl. ................................. 438/398; 438/255
[58] Field of Search .................................. 438/396, 397, 438/398, 386, 255, 253, 254

[56] References Cited

U.S. PATENT DOCUMENTS

| | | |
|---|---|---|
| 5,037,773 | 8/1991 | Lee et al. . |
| 5,082,797 | 1/1992 | Chan et al. . |
| 5,102,832 | 4/1992 | Tuttle . |
| 5,112,773 | 5/1992 | Tuttle . |
| 5,126,280 | 6/1992 | Chan et al. . |
| 5,130,885 | 7/1992 | Fazan et al. . |
| 5,138,411 | 8/1992 | Sandhu . |
| 5,202,278 | 4/1993 | Mathews et al. . |
| 5,236,860 | 8/1993 | Fazan et al. . |
| 5,278,091 | 1/1994 | Fazan et al. . |
| 5,320,880 | 6/1994 | Sandhu et al. . |
| 5,338,700 | 8/1994 | Dennison et al. ....................... 438/396 |
| 5,418,180 | 5/1995 | Brown . |
| 5,623,243 | 4/1997 | Watanabe et al. . |
| 5,759,262 | 6/1998 | Weimer et al. ........................... 438/964 |
| 5,763,286 | 6/1998 | Figura et al. ............................ 438/398 |
| 5,786,250 | 7/1998 | Wu et al. ................................. 438/255 |

Primary Examiner—Tuan H. Nguyen
Attorney, Agent, or Firm—Knobbe, Martens, Olson & Bear, LLP

[57] ABSTRACT

Disclosed is a bi-level container capacitor in which a bottom portion is smooth and an upper portion is rugged or rough. Once the container has been formed within a thick insulating layer, a conductive layer is conformally deposited over the container interior surfaces. The bottom portion of the container, which is narrowly confined between two gate electrodes, is isolated from further processing by filling the bottom portion with a protective film. A rugged conductive layer is then formed only on the surface of the upper portion of the container, after which the protective film is removed from the bottom portion. As a result, a capacitor bottom plate conforms to the interior surfaces of the container, the bottom plate including a rugged upper portion and a smooth bottom portion.

22 Claims, 6 Drawing Sheets

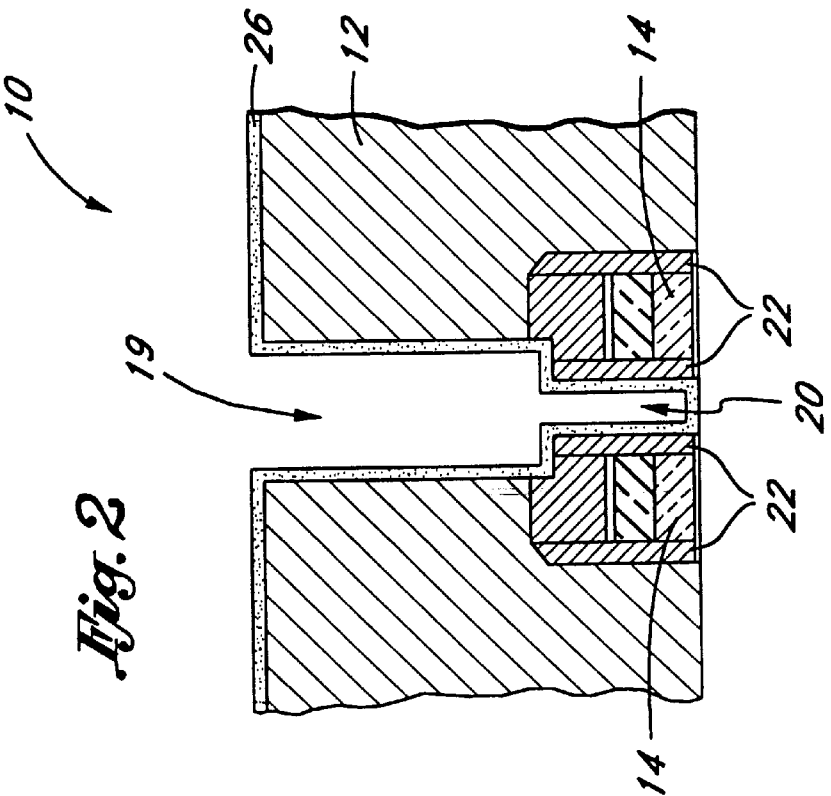
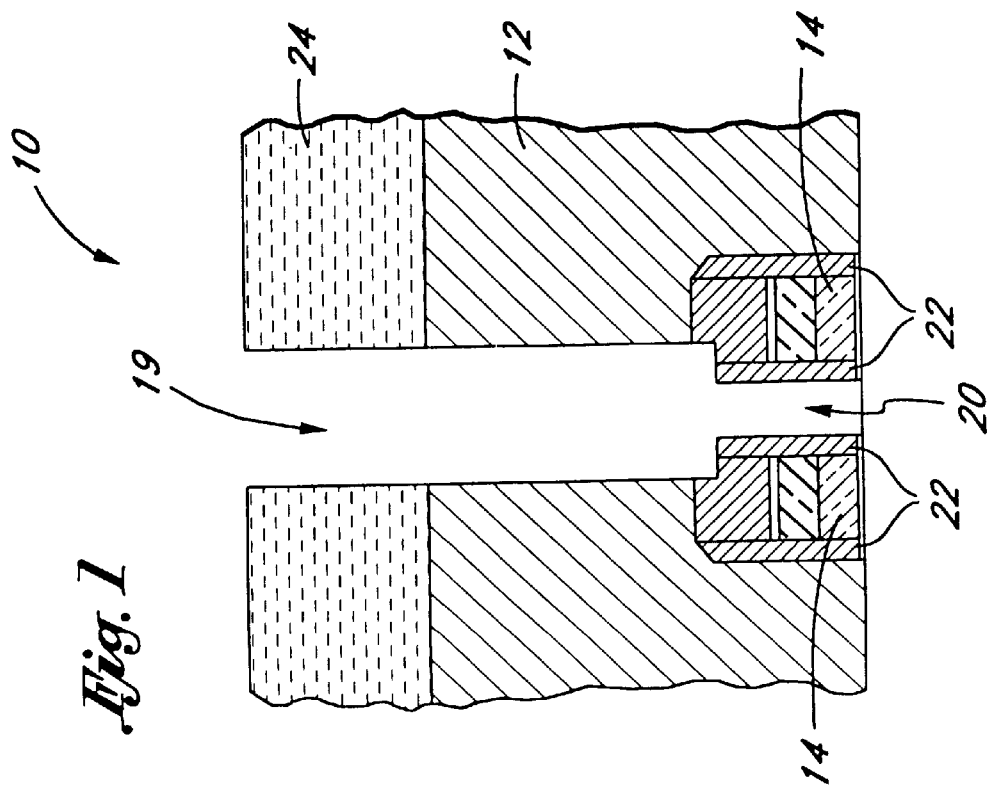

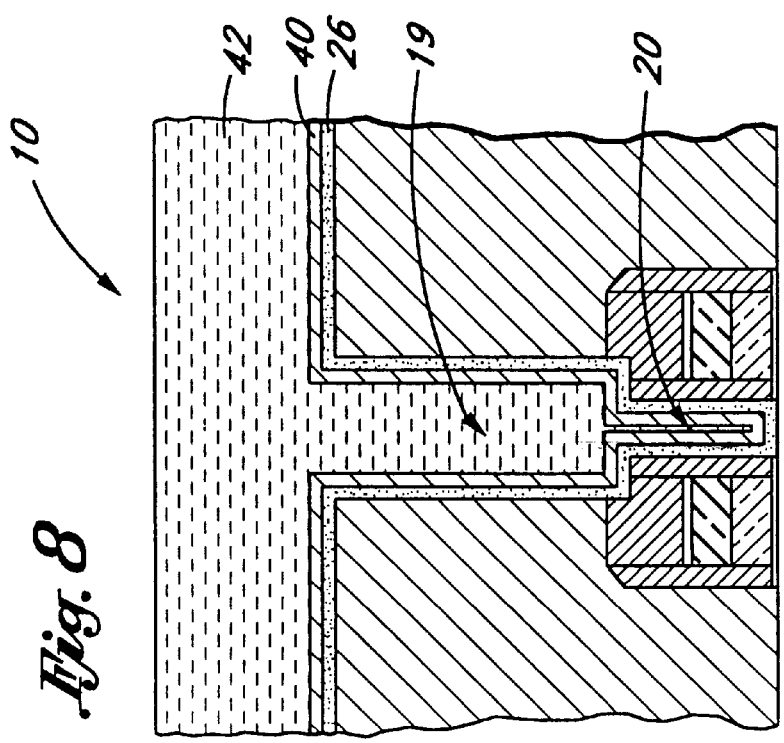
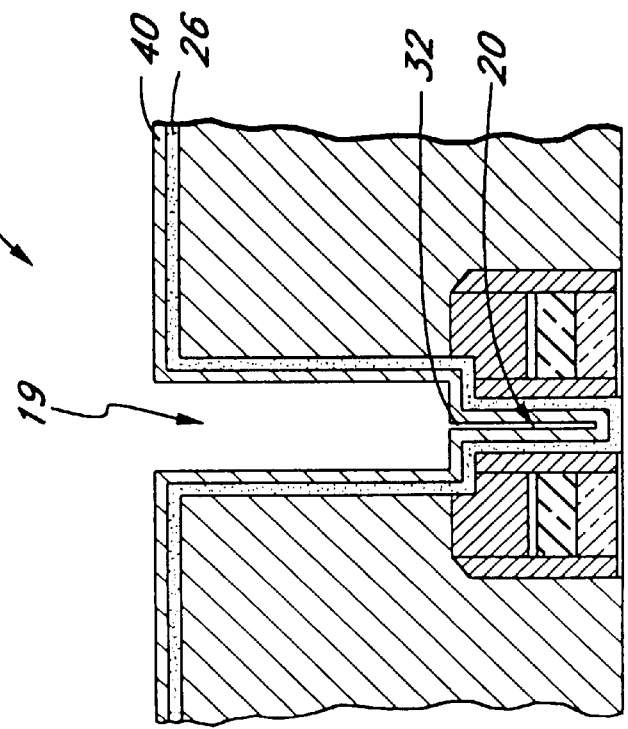

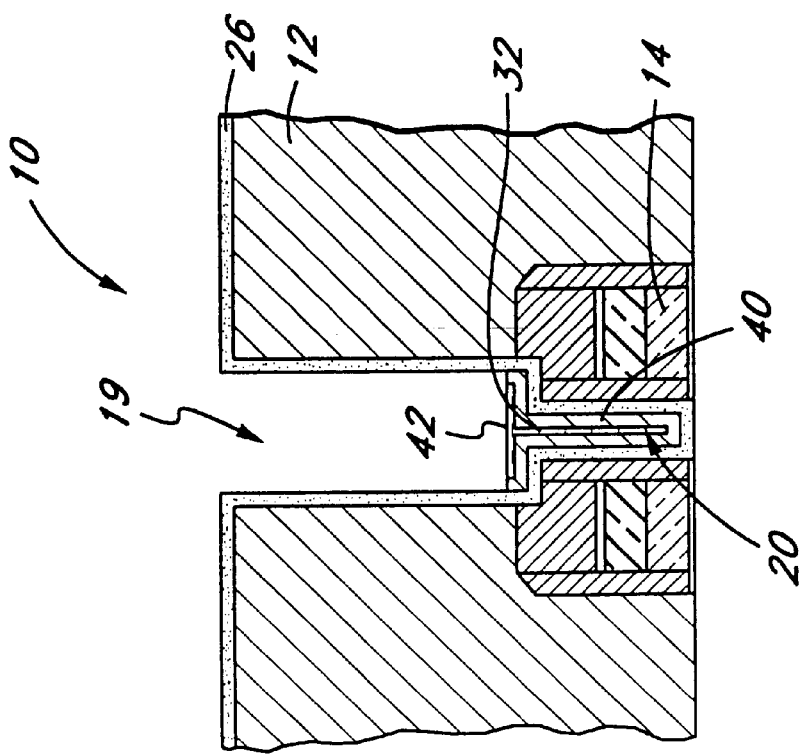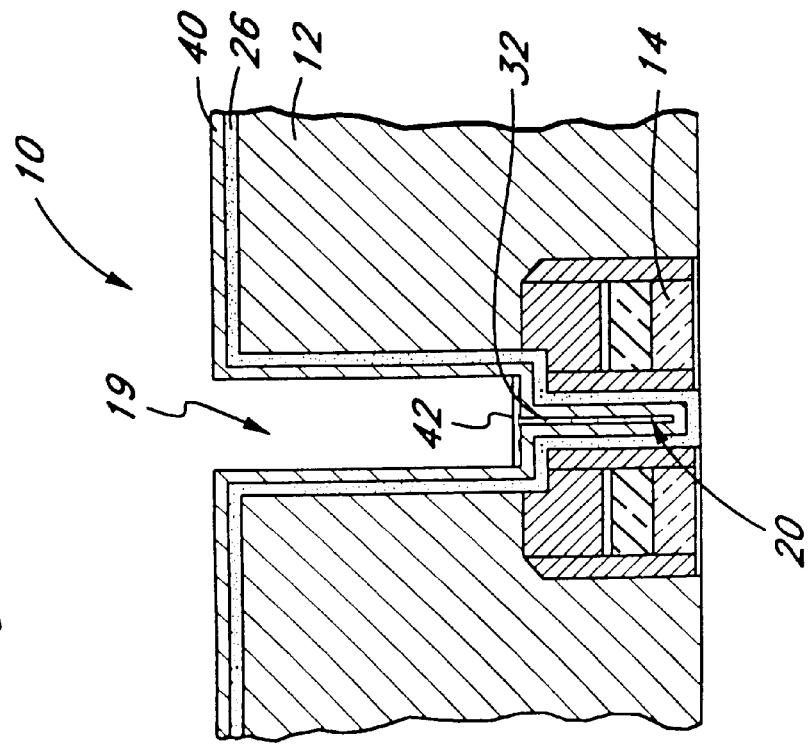

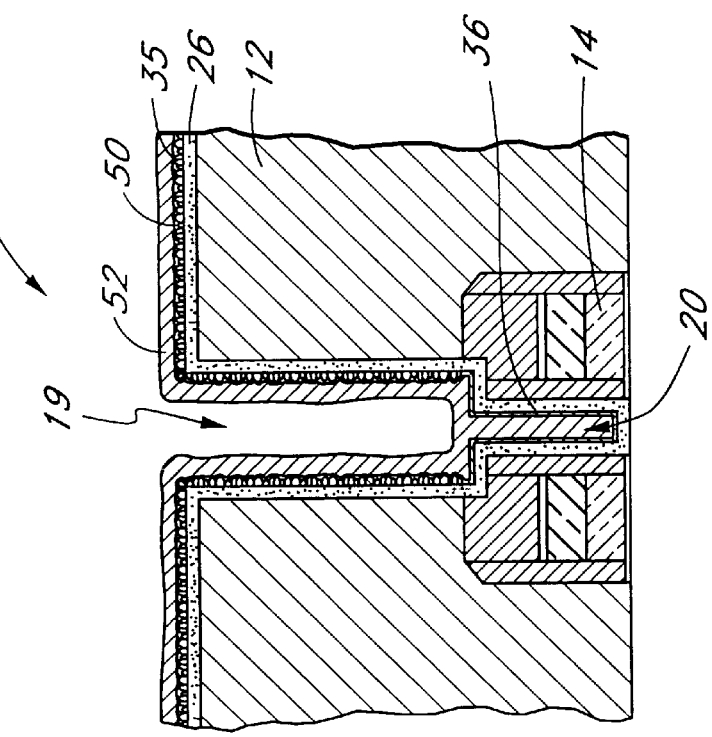
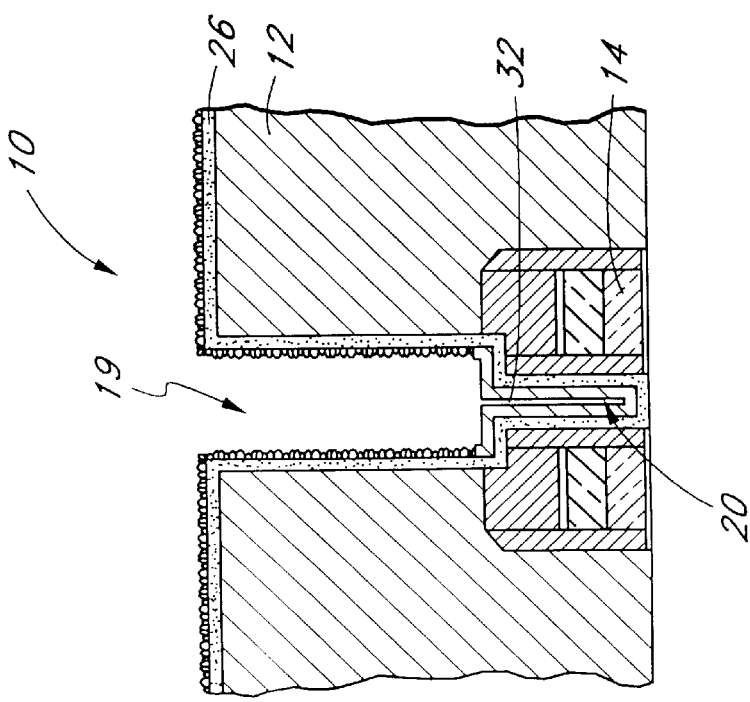

METHOD FOR FORMING AN INTEGRATED CIRCUIT CONTAINER HAVING PARTIALLY RUGGED SURFACE

This is a divisional of application Ser. No. 08/575,120 filed Dec. 19, 1995, which is now U.S. Pat. No. 5,801,413.

BACKGROUND OF THE INVENTION

The present invention relates to containers having roughened or rugged surfaces, and more particularly to capacitor containers for integrated circuits.

Recent advances in the miniaturization of integrated circuits have led to smaller chip areas available for devices. High density dynamic random access memory chips (DRAMs), for example, leave little room for the storage node of a memory cell. Yet, the storage node (capacitor) must be able to store a certain minimum charge, determined by design and operational parameters, to ensure reliable operation of the memory cell. It is thus increasingly important that capacitors achieve a high stored charge per unit area.

Traditionally, capacitors integrated into memory cells have been patterned after the parallel plate capacitor. An interlayer dielectric material is deposited between the deposition of two conductive layers, which form the capacitor plates. Several techniques have recently been developed to increase the total charge capacity of the cell capacitor without significantly affecting the chip area occupied by the cell. These include the use of new high dielectric materials between the plates. Other techniques concentrate on increasing the effective surface area of the plates by creating folding structures, such as trench or stacked capacitors. Such structures better utilize the available chip area by creating three dimensional shapes to which the conductive plates and interlayer dielectric conform.

FIG. 1, for example, illustrates a container capacitor structure 10 for a DRAM memory cell. An insulating or dielectric layer 12, such as boron phosphosilicate glass (BPSG), is planarized and patterned with a photolithographic mask. The dielectric layer 12 is then etched through the resist mask 24 between a pair of gate electrodes 14 to an underlying silicon substrate, thus forming the container structure 10. The etch may select against nitride insulation of the gate electrodes 14, for example, including nitride sidewall spacers 22. The container 10 is essentially A a cylindrical cavity, but it is illustrated in FIG. 1 in schematic cross-section, for simplicity, without showing the backwall of the cylinder. A conductive layer (not shown in FIG. 1) would then be conformally deposited over the walls of the container 10 to serve as the bottom plate. The interlayer dielectric and top plate would be successively deposited over the bottom plate, forming a capacitor.

The surface area of the capacitor plates, and thus the capacitance of the memory cell, may also be increased by providing a roughened or texturized plate surface. Roughened or rugged polycrystalline silicon (polysilicon, or simply poly) in the form of hemispherical silicon grains (HSG), for example, has been utilized for the bottom plate of the capacitor. The resultant increase in effective area of the plates, has been observed to increase the capacitance of a storage node by more than 60%.

At the same time, the formation of HSG also increases the thickness of the bottom plate, generally by more than 500 Å and often closer to 600 Å. For the container structure 10 of FIG. 1, this added thickness over the container walls still leaves adequate space within the container 10 for additional layers in an upper portion 19. The added thickness may become critical, however, at a bottom portion 20 of the container 10, which is narrowly confined between the gate electrodes 14. In high-density DRAM chips, the pair of gate electrodes 14 are less than 0.35 microns (3,500 Å) apart. Sidewall spacers 22, which isolate the gate electrodes 14 from the capacitor to be formed, occupy 700 Å on either side of the container 10 cross-section, leaving a diameter of only about 2,100 Å for the remainder of the capacitor structure within the bottom portion of the container 10. These 2,100 Å may easily be filled by the bottom plate to be formed of an amorphous or polysilicon layer (about 500 Å around the container circumference) and the HSG formed over the silicon layer (about 600 Å). These thicknesses represent reductions in the radius of the container and must be doubled in calculating the reduction of the container diameter.

It can be seen, then, that the formation of HSG for the bottom plate is likely to short across the entire bottom portion 20 of the container 10. Such shorting and consequent loss of capacitance is even more likely, if not assured, as integrated circuit dimensions are further scaled down. In fact, prior art storage node capacitors of similar configuration have filled the bottom portion 20 with a conductive plug, purposefully shorting the bottom portion 20 and forming HSG over the walls of the upper portion only. Thus, the surface area of the bottom portion 20 does not contribute to the surface area of the bottom plate and significant losses in capacitance result.

SUMMARY OF THE INVENTION

Disclosed is a container in an integrated circuit, including a capacitor bottom plate having a partially rugged surface, and a method for making the same.

The method involves the formation, in an insulating dielectric layer, of a container structure having an upper portion and a bottom portion. A first conductive layer is conformally deposited over the container's interior surfaces. The bottom portion is isolated with a protective film. Thereafter, a conductive rugged layer is formed on the interior surface of the container's upper portion. The protective film isolating the bottom portion may then be removed.

In a first preferred embodiment, the protective film comprises a thick layer of insulating material, such as BPSG, which is deposited to substantially fill the container. An optional anneal aids reflow of BPSG to ensure filling of the bottom portion. The protective film should be recessed down to about the top of the bottom portion, leaving the upper portion substantially free of the protective film. The rugged layer is then formed, in the form of hemispherical silicon grains, on the surface of the upper portion. The protective layer should then be stripped away.

In a second preferred embodiment, the protective film comprises a thin, conformal insulating layer over the conductive layer, and a filler. The insulating layer is preferably an oxide and the filler is preferably photoresist. As in the first preferred embodiment, the protective layer is recessed to about the top of the bottom portion, though this recessing step may require two sub-steps: a first step for recessing the filler and a second step for recessing the thin insulating layer. Thereafter the process is essentially the same as that described above with reference to the first preferred embodiment.

Thus, the present invention discloses a capacitor structure wherein a capacitor bottom plate conforms to a container which has a bottom portion and an upper portion. The bottom plate comprises a relatively smooth conductive layer within the bottom portion of the container and a rugged conductive layer within the upper portion of the container. The interlayer dielectric and top conductive plate may then be deposited over the bottom plate, as provided for in the prior art.

BRIEF DESCRIPTION OF THE DRAWINGS

FIG. 1 is a partial schematic section of a prior art integrated circuit, prior to formation of a rugged surface thereon. FIG. 1 also represents a starting point for the preferred embodiments of the present invention.

FIGS. 2–6 illustrate generally the process of forming a rugged surface on the integrated circuit of FIG. 1, in accordance with a first preferred embodiment of the present invention.

FIGS. 7–11 illustrate generally the process of forming a rugged surface of the integrated circuit of FIG. 1, in accordance with a second preferred embodiment of the present invention.

FIG. 12 illustrates a capacitor structure, in accordance with the preferred embodiments, after formation of a capacitor dielectric and top plate.

DETAILED DESCRIPTION OF THE PREFERRED EMBODIMENT

Figure 4:
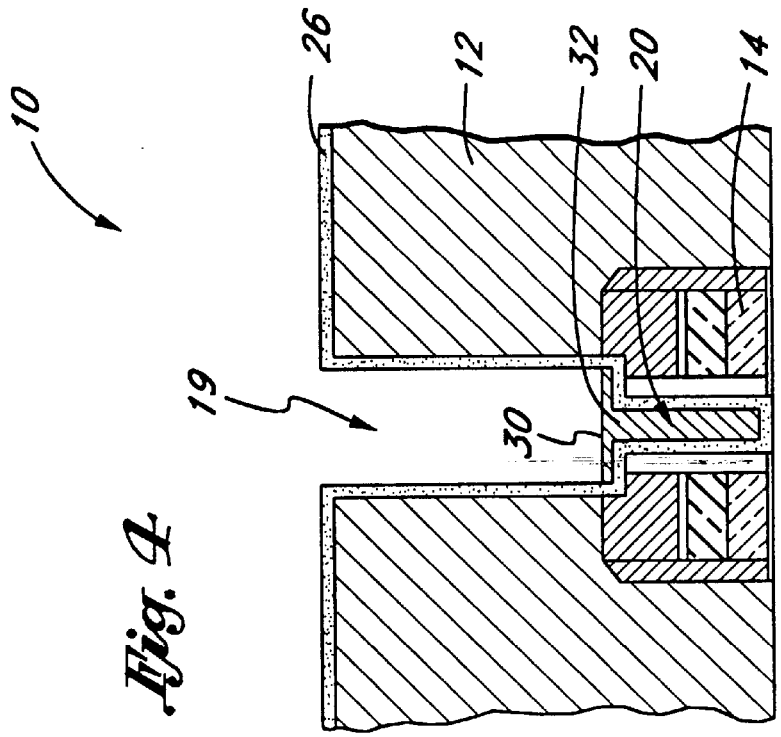

Although the present description focuses on the context of a DRAM cell, it will be understood that the present invention may have utility in many applications where a conductive layer of rough or high surface area is desired. Such applications include capacitors of all sorts, and especially capacitors integrated into electronic circuitry.

FIG. 1 illustrates a starting point for a first preferred embodiment of the present invention. The container structure 10 for a stacked capacitor has been defined by a standard photolithographic step and subsequently etched through the insulating layer 12, as described in the "Background" section above. The insulating layer 12 may comprise any of a number of dielectric materials, such as oxide, nitride, or TEOS, but it comprises BPSG in the first preferred embodiment. A pattern of photoresist 24 is then stripped away, also using known processes such as oxidizing-type wet stripping or dry etching, and the wafer cleaned of native oxide prior to deposition of subsequent layers. Photoresist stripping techniques are discussed in more detail in Wolf & Tauber, "Silicon Processing for the VLSI Era: Volume 1—Process Technology," pp. 518, 564–65, which discussion is hereby incorporated by reference.

As illustrated in FIG. 2, a conformal layer of conductive material 26 is next deposited over the insulating layer 12. This conductive layer 26 will provide mechanical and electrical support for the rugged surface layer to follow and so any conductive material may be used which may also serve as a seed layer for hemispherical grain growth. For the preferred embodiment, the conductive layer 26 comprises silicon, such as amorphous silicon ($\alpha$-Si) or polycrystalline silicon (polysilicon), and most preferably amorphous silicon.

The amorphous silicon layer 26 may be deposited to a thickness of between 200 and 600 Å, most preferably about 400 Å, by known methods. Chemical vapor deposition (CVD), and especially low pressure CVD, is preferred due to the conformality which may be achieved using these methods. Thus, an LPCVD process is preferred with silane ($SiH_4$) as the silicon source, at a temperature of between about 450° C. and 650° C., most preferably about 520° C., and a pressure of between about 100 mTorr and 400 mTorr, most preferably about 200 mTorr.

Figure 3:
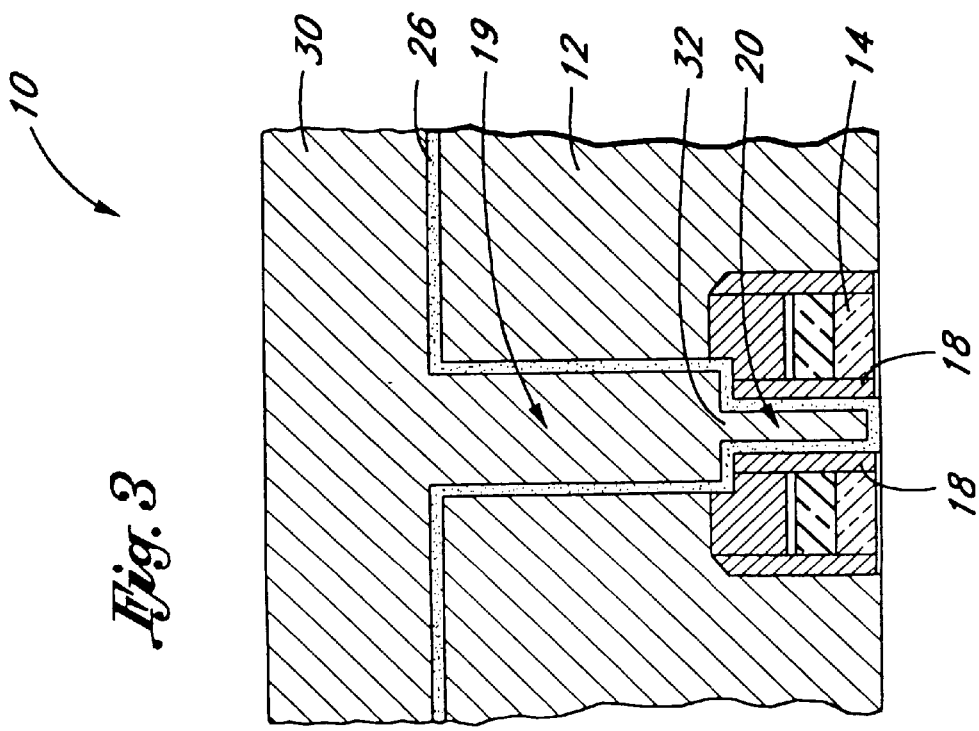

FIG. 3 illustrates the next step for the method of the first preferred embodiment, wherein a thick protective film 30 is deposited into the container 10. The protective film 30 serves to isolate the bottom portion 20 of the container 10 from the rugged surface formation to follow. To perform this function, dielectric materials such as oxides, nitrides, TEOS, spin-on glass or BPSG are preferred, and BPSG is most preferred. An anneal step may be performed after the deposition to allow BPSG reflow, ensuring better coverage of the BPSG into the narrow bottom portion 20 of the container 10 and thus minimizing the presence of voids within the protective film 30.

The protective film 30 may be deposited to fill only the bottom portion 20, leaving the upper portion 19 of the container substantially clear of the protective film. For the first preferred embodiment, however, the protective film 30 preferably fills the container completely, as shown in FIG. 3. The protective film 30 is then recessed down to approximately a top level 32 of the bottom portion 20 (see FIG. 4). Most preferably, the protective film 30 should be recessed to a point about 0.1 micron above the top level 32 of the bottom portion 20, to ensure no rugged surface forms within the bottom portion 20 during later process steps. Thus, if the bottom portion 20 is 0.7 microns high, in the vertical dimension, the protective film 30 should be recessed to a height of 0.8 microns over the substrate, as will be described in more detail below.

The process of recessing the protective film 30 will depend upon the material used for the protective film 30, but at any rate the process should preferably selectively and controllably etch the protective film 30 against the underlying conductive layer 26. Where the protective film 30 comprises BPSG and the conductive layer 26 comprises amorphous silicon, a reactive ion etch (RIE) is preferred. For example, an RIE reactor may flow 25 sccm of $CF_4$ and 35 sccm of $CHF_3$. The chamber pressure should be maintained between about 50 mTorr and 200 mTorr, most preferably at about 100 mTorr, and the applied RF energy at between about 500 W and 800 W, most preferably about 700 W. Alternatively, a diluted HF solution (between 10:1 and 100:1 $H_2O$:HF) may etch the BPSG at a controllable rate to the appropriate level, and buffering agents such as $NH_4F$ may stabilize the reactions to maintain a constant etch rate. The amorphous silicon layer 26 in the container's bottom portion 20 and the HSG remain relatively unharmed by this etch.

The wafer should be etched for enough time to clear the protective film 30 through the upper portion 19 of the container 10 except for a cushion of about 0.1 micron, as will be understood by one of skill in this art. Thus, if the total container height is 1.7 microns (of which the bottom 0.7 micron represents the bottom portion 20), and the container 10 is filled with protective film 30 to the top and planarized, it is necessary to etch down about 0.9 micron, and no more than about 1.0 micron in order to avoid exposing the bottom portion 20. Since etch rates are well known for different etchants, it will be readily apparent to one of skill in this art how much time is necessary to recess the protective film 30 to the appropriate level. FIG. 4 illustrates the result of these steps. The bottom portion 20 has been isolated by the protective film 30, whereas the conductive layer 26 remains exposed in the upper portion 19 of the container 10.

Figure 5:
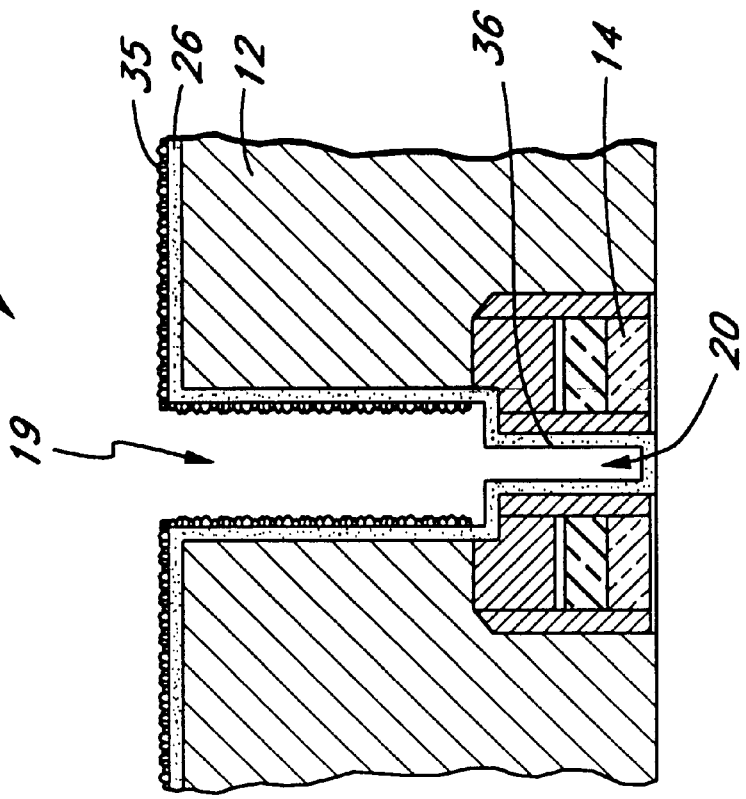

With the conductive layer 26 of the upper portion 19 thus exposed, a rugged layer 35 (FIG. 5) may be formed on the exposed portions of the conductive layer 26. The rugged layer 35 of the preferred embodiments comprises a layer of hemispherical silicon grain (HSG), although rugged metal, silicide or other conductive layers may be equally appropriate for capacitor applications. HSG formation is well known in this art and many different known processes may be used in conjunction with the present invention. For example, U.S. Pat. No. 5,320,880, issued to Sandhu et al.; U.S. Pat. No. 5,202,278, issued to Mathews et al.; U.S. Pat. No. 5,112,773, issued to Tuttle; and U.S. Pat. No. 5,102,832, also issued to Tuttle, all disclose methods of forming HSG for providing greater capacitance in a memory cell storage node. These documents are hereby incorporated by reference.

The preferred embodiments of the present invention, however, incorporate a method of forming HSG by silicon seeding and annealing in vacuum or at low pressure, which method is known to those skilled in the art of integrated circuit fabrication. For this HSG forming step, the amorphous silicon conductive layer 26 is cleaned of any native oxide which may have formed prior to silicon seeding over the conductive layer 26. The seeded amorphous layer is then annealed at temperatures between about 550° C. and 650° C., most preferably at about 550° C., in a vacuum chamber (pressure between $10^{-7}$ mTorr and $10^{-10}$ mTorr, most preferably about $10^{-8}$ mTorr, in the absence of oxygen). The anneal can also be performed at low pressures (e.g., about 600 mTorr). The anneal causes a surface migration of silicon atoms to preferentially nucleate and form the silicon grains of the rugged layer 35.

Figure 6:
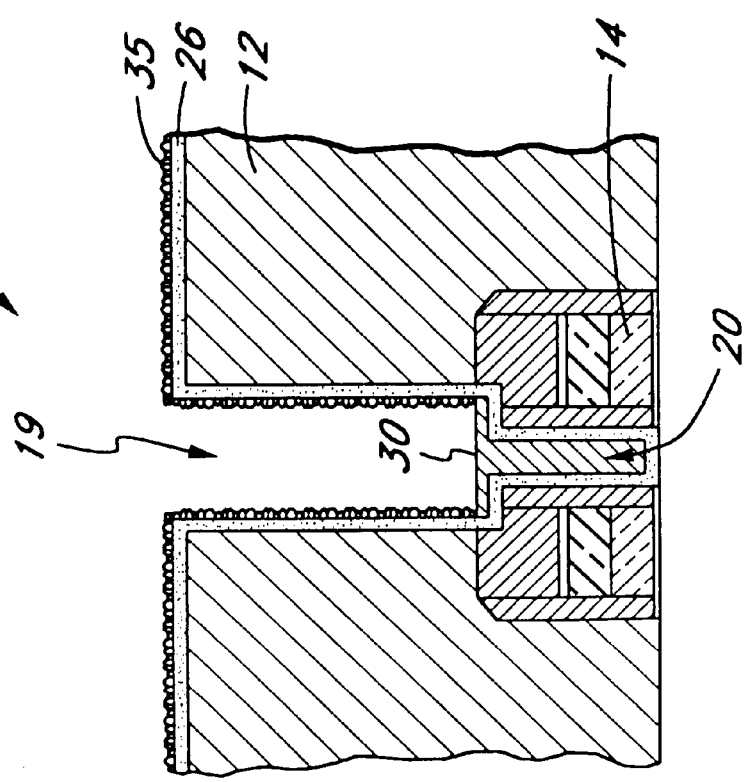

The protective film 30 is removed after the rugged layer 35 has been formed, as illustrated in FIG. 6. Though anisotropic dry etches and other removal techniques may be utilized, a conventional wet etch is preferred for this step, as wet etches are known to be inexpensive, selective over silicon, and will remove the protective film 30 of the first preferred embodiment or of other embodiments using any form of silicate oxide for the protective film.

FIG. 6 thus illustrates the product of the present invention, wherein a container has been formed with a partial rugged surface. The rugged layer 35 substantially lines the upper portion 19 of the container 10, except for a small cushion zone near the bottom portion 20. The bottom portion 20 of the container 10, on the other hand, is lined with a smooth layer 36, which represents the exposed portion of the conductive layer 26. The smooth layer 36 partially extends into the upper portion 19 in this preferred embodiment, the extension of about 0.1 micron representing the cushion zone to avoid overetch into the bottom portion during the recess step described above.

The same structure illustrated in FIG. 6 may be fabricated by the process of a second preferred embodiment, using a different form of protective film. After the conductive layer 26 has been deposited, as shown in FIG. 2, a thin dielectric layer 40 is deposited (FIG. 7), rather than the thick protective film 30 of the first preferred embodiment. One of many dielectric materials, such as oxides, tetraethyl orthosilicate (TEOS), or nitrides, may be used for this layer, and the dielectric 40 is preferably an oxide ($SiO_2$). The dielectric layer 40 should be less than 500 Å thick, more preferably less than 300 Å and most preferably about 100 Å.

A filler material 42 (FIG. 8) is then deposited, preferably comprising a conformal film which may fill the narrow bottom portion 20 of the container. The second preferred embodiment utilizes a photoresist for this filler material 42. Together, the thin dielectric layer 40 and the filler material 42 take the place of the thick protective film 30 of the first preferred embodiment. Thus, the filler material 42 must also be recessed to a point approximately 0.1 micron above the top level 32 of the bottom portion 20, as illustrated in FIG. 9. Wet etch, dry etch or phot expose/develop may be used to recess the filler material 42, depending upon the material used for this layer. For example, photoresist of the second preferred embodiment may be stripped using a plasma $O_2$ (or $O_3$), without attacking the underlying dielectric layer and silicon.

Once the filler 42 has been recessed, the thin dielectric layer 40 must also be cleared from the conductive layer 26 on the surfaces of the upper portion 19 of the container 10, in order that the rugged surface may be formed on the conductive layer 26. A standard selective wet or dry etch may be used for this step, although an isotropic etch is preferred. For example, a diluted (between about 10:1 and 200:1, preferably about 100:1) HF wet etch solution may selectively etch the $SiO_2$ of the dielectric layer 40 without attacking the silicon of the underlying conductive layer 26, in the second preferred embodiment. The recessed filler 42 substantially protects the portion of the dielectric layer 40 within the bottom portion 20 of the container 10 from exposure to this etch.

The filler 42 may be stripped with wet or dry etch processes, preferably an $HNO_3/H_2O_2$ wet etch, and it is preferably stripped prior to HSG formation. The HSG 35 (FIG. 11) may be formed over the exposed conductive layer 26 of the container's upper portion 19, by the same process described above in conjunction with the first preferred embodiment. The removal of the dielectric 40 remaining in the bottom portion 20 may also be performed by a wet etch (e.g., 100:1 HF). After this removal step, the container 10 will resemble the container of FIG. 6, having both the smooth layer 36 and rugged layer 35 lining the bottom portion 20 and upper portion 19 of the container 10, respectively.

Together, the smooth layer 36 and the rugged layer 35 may form the bottom plate of a storage node capacitor. Referring to FIG. 12, as with prior art container capacitors, the fabrication of the circuit may be continued with the deposition of a dielectric interlayer 50 over the bottom plate, and another conductive plate 52 over the dielectric. The capacitance of the resultant storage node would be greater than that of storage nodes having either completely smooth bottom plates or rugged upper portions and shorted bottom portions.

Specifically, if the height of the bottom portion 20 is about 0.7 micron and the the height of the upper portion 19 is 1.0 microns, the total capacitance of a smooth plate capacitor conforming to this container 10 may be considered to have a value of (1.7x), where x is a proportionality constant having units of farads/microns, for example. Capacitance is here assumed proportional to height of the container (or portion thereof) where all other variables are held constant. If a rugged layer was deposited over the entire surface of the container 10, as with prior art methods, the bottom portion 20 would be shorted out. Only the surface of the upper portion 19 (1.0 micron) would contribute to the capacitance, although that surface would have increased in area by 60%, increasing capacitance of that surface by a factor of 1.6. Such a structure would demonstrate a capacitance of (1.0*1.6*x), or (1.6x), which is even less than that of a smooth-walled container capacitor which does not short out.

On the other hand, the present invention permits increasing the contribution to capacitance of the upper portion 19, through the use of HSG, without shorting out and completely losing the bottom portion 20 of the container 10. For the purposes of approximating the relative capacitance of the container storage node of the present invention, "upper portion" is defined as that region of the container surface having the rugged layer 35 thereupon. The capacitance of this region would equal (0.9*1.6*x), where the upper portion has a height of 0.9 micron and the factor of 1.6 derives from the 60% increase in capacitance due to HSG increasing the surface area of the container's upper portion. The smooth portion of the container, including the bottom portion 20 and, in the preferred embodiments, 0.1 microns above the bottom portion 20, contributes about (0.8x) to the capacitance of the container 10, where the height of the smooth portion is about 0.8 micron. Together, these give a total capacitance of about (2.24x).

Note that the above calculations are only approximations which do not account for the differences in diameter of the upper portion 19 and bottom portion 20. It is clear, however, that the present invention increases the capacitance over the smooth container (by providing a rugged surface 35 on the upper portion 19) and over prior art rugged containers (by reducing likelihood of shorting out the bottom portion 20).

Although the foregoing invention has been described in terms of certain preferred embodiments, other embodiments will become apparent to those of ordinary skill in the art, in view of the disclosure herein. Accordingly, the present invention is not intended to be limited by the recitation of preferred embodiments, but is instead intended to be defined solely by reference to the appended claims.

I claim:

1. A method of forming, in an integrated circuit, a container having an interior wall with a partially rugged surface, the method comprising:

forming a container in an insulating layer, the container extending from an upper edge of the insulating layer to a substrate;

depositing a conductive layer conformally into the container;

isolating a bottom portion of the container with a protective film, the bottom portion extending from the substrate to a top level between the upper edge and the substrate, an upper portion of the container extending above the top level to the upper edge;

forming a rugged conductive surface over the interior wall of the upper portion of the container; and removing the protective film from at least a part of the bottom portion of the container.

2. The method of claim 1, wherein the container is narrower at the bottom portion than at the upper portion.

3. The method of claim 1, wherein the bottom portion is between two gate electrodes.

4. The method of claim 3, wherein the conductive layer comprises amorphous silicon.

5. The method of claim 1, wherein the conductive layer comprises silicon.

6. The method of claim 5, wherein depositing, the conductive layer step comprises a low pressure chemical vapor deposition.

7. The method of claim 1, wherein forming the rugged conductive surface comprises forming hemispherical silicon grains over the conductive layer.

8. The method of claim 7, wherein the hemispherical silicon grains are formed by silicon seeding and anneal to cause migration of silicon atoms to nucleation sites.

9. The method of claim 1, wherein the protective film substantially covers the bottom portion of the container.

10. The method of claim 1, wherein isolating the bottom portion comprises filling at least the bottom portion of the container with the protective film.

11. The method of claim 1, wherein isolating the bottom portion comprises at least substantially filling the container with the protective film; and recessing the protective film to about the top level of the bottom portion of the container.

12. The method of claim 11, wherein recessing the protective film comprises recessing the film to about 0.1 micron above the top level of the bottom portion of the container.

13. The method of claim 11, wherein the protective film comprises a dielectric layer filling the bottom portion of the container.

14. The method of claim 13, wherein at least substantially filling the container comprises depositing a boron phosphosilicate glass into the container; and heating the container to allow glass reflow.

15. The method of claim 14, wherein recessing the protective film comprises a reactive ion etch.

16. The method of claim 11, wherein the protective film comprises a conformal dielectric layer and a filler material.

17. The method of claim 16, wherein the conformal dielectric layer comprises an oxide and the filler material comprises a photoresist.

18. The method of claim 17, wherein recessing the protective film comprises:

etching the filler material with an oxygen plasma etch; and wet etching the conformal dielectric layer with a diluted, buffered HF solution.

19. The method of claim 18, wherein removing the protective film comprises removing both the filler material and the conformal dielectric layer.

20. The method of claim 19, wherein removing the protective film comprises:

wet etching the recessed filler material with an $HNO_3/H_2O_2$ solution prior to the rugged surface forming step; and wet etching the recessed conformal dielectric material with an HF solution after forming the rugged surface.

21. The method of claim 1, wherein removing the protective film step comprises a wet etch.

22. A method of forming a capacitor within a container structure in an integrated circuit, the method comprising:

etching a container in an insulating layer overlying a semiconductor substrate, the container having a narrow bottom portion extending upwardly from the substrate between two gate electrodes and an upper portion extending above the bottom portion, the bottom portion having a diameter of less than about 0.35 micron;

depositing a silicon layer conformally into the container;

isolating the bottom portion of the capacitor by filling the container with a protective film and recessing the protective film to about a top level of the bottom portion to leave the silicon layer of the upper portion substantially exposed;

forming a layer of hemispherical silicon grains on the exposed silicon layer of the upper portion;

removing the protective film from the bottom portion of the container to expose the silicon layer of the bottom portion;

depositing a dielectric layer into the container, the dielectric layer covering the exposed silicon layer of the bottom portion and the hemispherical silicon grains of the upper portion; and depositing a conductive layer over the dielectric layer.

* * * * *